US006710587B1

(12) United States Patent
Reynoso et al.

(10) Patent No.: US 6,710,587 B1
(45) Date of Patent: Mar. 23, 2004

(54) LOW MAGNITUDE CURRENT SENSOR USING UNBALANCED FLUX LINE DETECTION

(75) Inventors: Aaron L. Reynoso, San Jose, CA (US); Zhe Wu, San Jose, CA (US)

(73) Assignee: Solidone USA Corporation, Sunnyvale, CA (US)

( * ) Notice: Subject to any disclaimer, the term of this patent is extended or adjusted under 35 U.S.C. 154(b) by 2 days.

(21) Appl. No.: 10/269,384

(22) Filed: Oct. 11, 2002

(51) Int. Cl.$^7$ ............................................. G01R 33/00
(52) U.S. Cl. ............................. 324/117 R; 324/117 H; 324/158.1
(58) Field of Search .................... 324/117 R, 117 H, 324/158.1; 361/42, 45

(56) References Cited

U.S. PATENT DOCUMENTS

| | | | |
|---|---|---|---|
| 3,959,693 A | * 5/1976 | Coley et al. | 361/45 |
| 4,280,162 A | * 7/1981 | Tanka et al. | 361/45 |
| 5,103,163 A | 4/1992 | McLyman | 324/117 H |
| 5,461,308 A | 10/1995 | Jin et al. | 324/117 R |
| 5,923,514 A | 7/1999 | Scott et al. | 361/93 |
| 5,933,306 A | 8/1999 | Santos et al. | 361/45 |
| 5,986,444 A | * 11/1999 | Powell | 324/117 R |
| 6,026,355 A | 2/2000 | Rahman et al. | 702/189 |
| 6,094,330 A | 7/2000 | Criniti et al. | 361/93.1 |
| 6,141,197 A | 10/2000 | Kim et al. | 361/93 |
| 6,191,589 B1 | * 2/2001 | Clunn | 324/424 |
| 6,194,893 B1 | 2/2001 | Yokotani et al. | 324/207.21 |
| 6,279,406 B1 | 8/2001 | Li et al. | 73/861.77 |

OTHER PUBLICATIONS

Honeywell Sensor Products, Application Note AN211, "Applications of Magnetic Position Sensors", 8 pages.
Infineon Technologies, Application Note, "Magnetic Sensors—Giant Magneto Resistors", Jul. 2001, 19 pages.
Philips Semiconductors, Application Note, AN00004, "Contactless Angle Measurement Using KMZ41 and UZZ9001", 50 pages.
Honeywell Sensor Products paper, "Linear/ Angular/Rotary Displacement Sensors", 4 pages.
Philips Semiconductors, "Philips Discrete Semiconductors Sensors for Non–Automotive Applications", 2000, 10 pages.

* cited by examiner

Primary Examiner—Evan Pert
Assistant Examiner—Tung X. Nguyen
(74) Attorney, Agent, or Firm—Thomas Schneck (57) ABSTRACT

A low current detector using magnetoresistive sensor is used in a ground fault detector that opens a current carrying circuit when an unbalanced or dangerous condition occurs in the circuit. The current circuit has windings wrapped around a toroidal member of magnetic material having a cross sectional gap. First magnetic flux lines induced in the toroidal member by the circuit project from the gap toward a permanent magnet having second emergent magnetic flux lines that bend the first flux lines in a flux line mesh zone when an unbalanced current exists in the current carrying circuit. The flux lines are non-existent in the gap of the toroidal member when the circuit is in a balanced or non-fault state. A magnetoresistive sensor is disposed in the mesh zone in a position producing a signal indicative of an unbalanced condition caused by a current fault. A circuit breaker, connected to flux sensor responds to the signal indicating an unbalanced condition by opening the circuit.

22 Claims, 6 Drawing Sheets

LOW MAGNITUDE CURRENT SENSOR USING UNBALANCED FLUX LINE DETECTION

TECHNICAL FIELD

The invention relates generally to a low magnitude AC and DC current sensor, and more particularly to such devices employing magnetoresistive sensors.

BACKGROUND ART

One of the most important electrical safety devices is a Ground Fault Circuit Interrupter (GFCI). GFCIs are designed to provide protection against electrical shock from ground faults, which occur when the electrical current in a circuit, either a wire line or an appliance, strays outside the path where it should normally flow. This ground fault, or unintentional electric path between a source of current and a grounded member, occurs when current is leaking somewhere—in effect, electricity is escaping to ground. If a human body provides a path to ground for this leakage the person could be burned, severely shocked or electrocuted. Such a condition may be a shock hazard, even when the current flow is insufficient to trip an electrical circuit breaker associated with the current flow.

Modern world-wide electrical codes require that certain circuits in electrical wiring systems likely to be in contact with moisture include current interrupting devices which are designed to protect the user against shock by interrupting power when a current leakage is initially detected. More commonly, however, GFCI devices are incorporated into electrical receptacles that are designed for installation in bathrooms, kitchens, spas, garages and outdoors. GFCI devices enjoy widespread use in many countries around the world. GFCI devices are sometimes called Earth Leakage Circuit Breakers (ELCB) or Earth Leakage Switches as well as Residual Current Circuit Breakers (RCCB) or Residual Current Devices (RCD).

Conventional GFCI devices that are designed to trip in response to the detection of a ground fault condition typically employ one of two methods. In one approach a first current transformer senses the circuit line current and a second transformer senses the circuit neutral current and a comparison circuit is used to determine whether there is a remainder current as indicative of a ground fault. Another approach uses a summing transformer to surround both the line and neutral conductors and determines the presence of a ground fault when the resultant current is below a predetermined value. In either case, when such an imbalance is detected, a circuit breaker within the GFCI device is immediately tripped to an open condition, thereby opening both sides of the AC line and removing all power from the load.

Around the world the applications for GFCI's involve a wide variety of conditions. For example, in the United States a ground fault current in excess of 6 milliamperes cannot be permitted. However, in other countries the permissible ground fault current may be as high as 30 milliamperes. Accordingly, a GFCI for use in all international situations must be able to provide protection against ground fault currents in the range of 6–30 milliamperes.

Also, not all countries utilize 60 hertz AC power that is utilized in the United States. Therefore, a GFCI for international applications must be able to provide protection for a frequency range of 50–60 hertz. Further, this GFCI will operate in applications requiring other AC frequencies such as 400-Hz, which is the standard electrical system operating frequency of commercial aircraft. In come situations the GFCI must be able to respond to pulsating DC requirements. GFCIs in the art do not presently meet all of these requirements in a satisfactory manner.

GFCI devices using current transformers ("CT") cannot sense DC current in power circuits for the reason that CTs only respond to AC current. At DC (zero) frequency, the output of a CT is zero so that a circuit incorporating a CT as a current measuring device has a 100% error. Even at frequencies of 30 Hz, prior art CT devices have a significant error in current measurement. A DC component in the AC mains will also cause a CT error.

An attempt to overcome prior art shortcomings is found in U.S. Pat. No. 5,986,444 to Powell. Powell teaches a device for detecting low magnitude electrical currents that may include leakage currents. A generally toroidally-shaped member made of magnetic material provides an air gap and a magnetoresistive device is located in the air gap for sensing a current flowing through a conductor that passes through the toroidal member. Magnetoresistive devices are resistive elements typically arranged in a Wheatstone or balanced bridge arrangement that changes resistance value in the presence of a magnetic field. In order to reduce damage due to overcurrents, the member has a portion of reduced cross-sectional area to cause saturation of the member. The apparatus measures the variation of magnetic field strength acting in the magnetoresistive sensor as a measure of current faults.

Saturated mode magnetoresistive sensors are popularly used as rotation speed sensors by detecting the existing magnetic flux bending when a gear, made of high permeability material like steel, is rotating nearby the surface. For example, see U.S. Pat. No. 6,194,893 to M. Yokotani et al. A permanent magnet is put under one side of the magnetoresistive sensor. When gear teeth fly by the other side of the sensor nearby, the unevenness of the gear surface causes a magnetic field to change its direction back and forth, which results in the change of resistance valus of magnetoresistor, causing a voltage signal to be generated.

Other patents of interest include U.S. Pat. No. 5,933,306 which use GMR sensors for use in a GFCI device. U.S. Pat. No. 5,923,514 shows use of a GM device within the gap of a toroid to measure magnetic field strength. U.S. Pat. No. 5,461,308 shows use of a GMR device in the airgap of a magnetic material for sensitive current measurement.

An object of the invention is to provide a reliable low current sensor without susceptibility to stray external magnetic fields, susceptibility to undesired saturation of the magnetic member due to current surges, and inability to measure a DC component while still providing protection to the consumer from hazardous leakage currents at all frequencies.

SUMMARY OF THE INVENTION

The above object has been met with a new current sensor that can be used in a frequency independent ground fault detector that substantially increases sensitivity, adjustability and reliability for low level leakage tripping. The new current sensing approach involves forcing magnetic field lines induced by an unbalanced portion of a circuit into a sensitive region of a magnetoresistive sensor. The unbalanced portion of the circuit is associated with a current fault in a pair of wires that are part of a current loop. The current fault is manifest due to magnetic flux lines in paired windings about a toroidal magnetic member, with non-cancelling magnetic flux lines, associated with the current fault, protruding from a gap in the toroidal magnetic member. At the same time, magnetic flux lines emerge from a nearby permanent magnet, with the two sets of flux lines permeating each other in a magnetic flux line mesh zone existing between the permanent magnet and the toroidal member. The magnetoresistive sensor has a sensitive region, which is normally planar, placed in the flux line mesh zone. Within the magnetic flux line mesh zone, the permanent magnet bends flux lines from the toroidal member into the sensitive plane of the sensor. By operating the magnetoresistive sensor in this manner, current through the sensor varies with changes in the balanced to unbalanced states of the toroidal member. Stability of operation and immunity to external electrical noise is promoted. The current signal produced by the sensor representing the unbalanced state is amplified, filtered and transmitted to a circuit interruption trip solenoid.

DESCRIPTION OF THE PREFERRED EMBODIMENT

Figure 1:
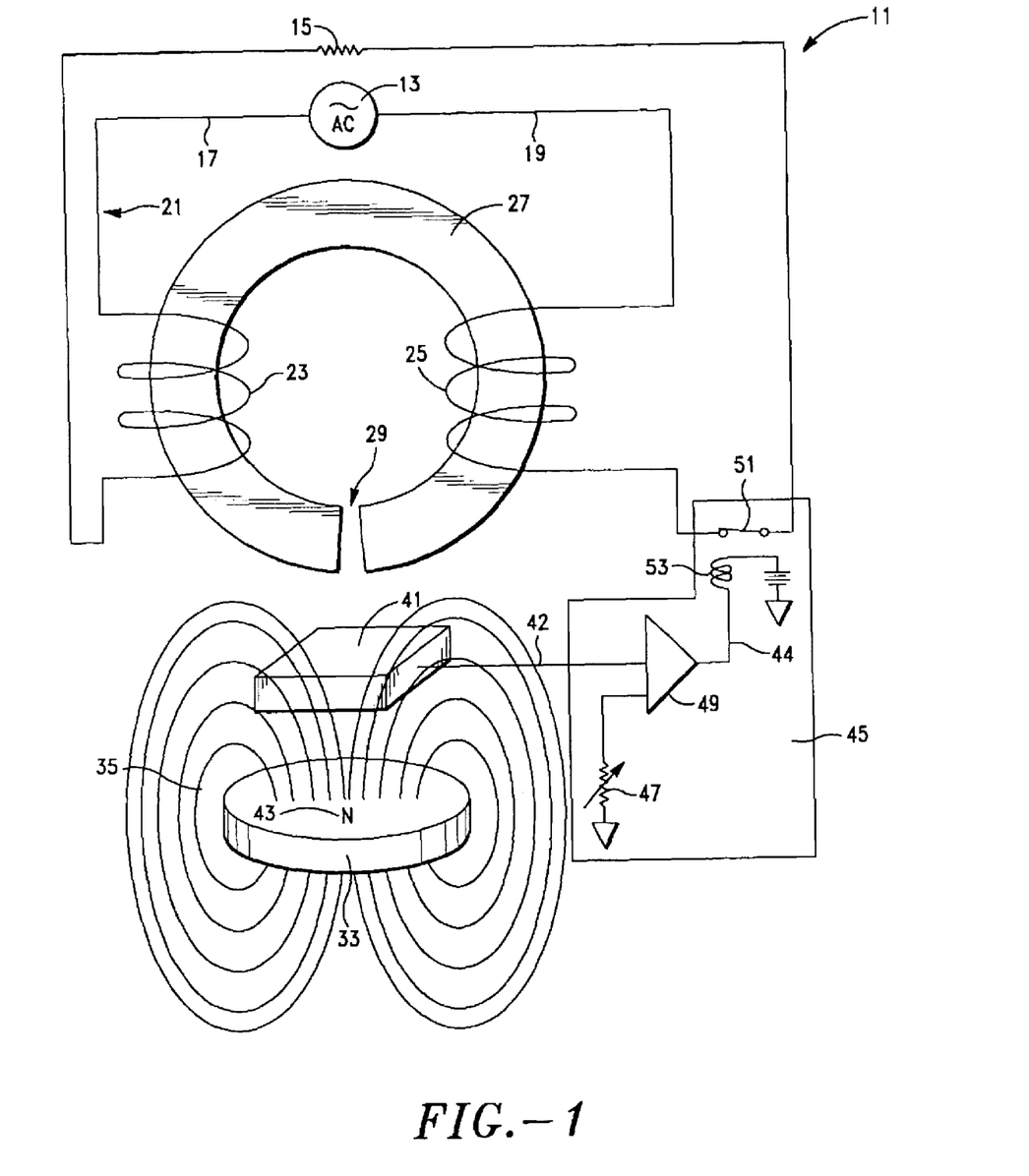
FIG. 1 is a perspective plan view of the apparatus of the present invention operating in a balanced state.

With reference to FIG. 1, a ground fault detector 11 is shown as part of a circuit including AC power source 13 connected by means of a current loop to a load 15. The principal component of the ground fault detector is the current sensor unit which senses an unbalanced condition between a hot side and a neutral side of the same current loop. The loop includes a neutral side 17, as well as a hot side 19 which may be part of an AC or DC circuit. The present invention operates with both AC and DC current sensing and works equally well with single phase or multiphase Circuits.

Figure 2:
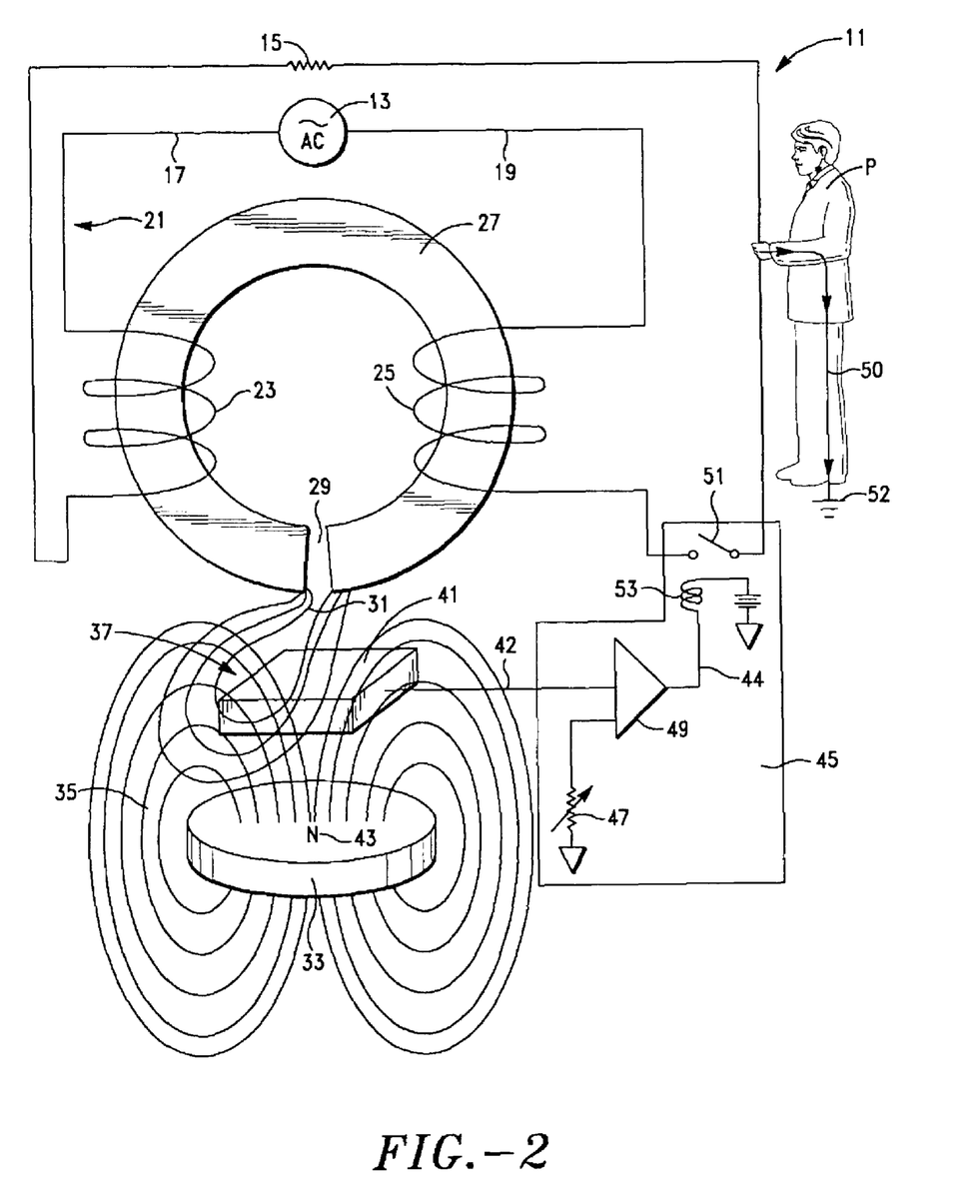
FIG. 2 is a perspective plan view of the apparatus of FIG. 1 operating in an unbalanced state.

The current loop includes balanced coils 23 and 25 which are wrapped about a small toroid 27 made of magnetic material, such as soft iron. For purposes of illustration, the coils are shown to be spaced apart. The best practice is to wind the coils together as later described with reference to FIGS. 6 and 7. Current carried by the current loop flows into the coils which induce magnetic fields in the toroid with associated flux lines. Typically, the coils have the same number of turns and one coil can be wound over the other coil in order to maintain equal tension. The coils are wound in the same direction but current is arranged to flow in opposite directions to induce magnetic flux in opposite directions. When the circuit has no faults, opposing magnetic fields are balanced and will cancel, but in a fault state magnetic flux appears in the gap 29. In other words, the flux lines travel around the toroid in the unbalanced current state and jump a small gap 29 in the cross-sectional dimension of the toroid, as seen in FIG. 2. The flux lines which jump the gap give rise to a first distribution of flux lines 31 which protrude outwardly from the gap.

Referring to both FIGS. 1 and 2, a permanent magnet 33 is placed below the toroid in a spaced-apart relation with one pole 43 facing the toroid. The permanent magnet has a second distribution of flux lines 35 permeating the flux sensor 41. Preferably, the flux sensor is a magnetoresistive sensor with sensor elements disposed in a Wheatstone Bridge configuration. An example of an integrated version of such a sensor is known as the HMC 1501 manufactured by Honeywell Sensor Products, with particular specifications at www.magneticseneors.com/spec$_{13}$ sheets/specs__1501.html. The flux sensor 41 is disposed in the region where the distribution of flux lines 35 will permeate sensor 41. Sensor 41 has a sensitive region, usually a plane in which the sensor elements lie.

In FIG. 2, the second distribution of flux lines 35 meshes with a first distribution of flux lines 31 emerging from toroid 27 in a mesh zone 37. The second distribution interacts with the first distribution whereby at least a portion of the first distribution is forced into the sensitive region of the sensor. This condition exists only in the unbalanced current state. In the balanced current state there is no first distribution of flux lines. The only flux lines in the flux sensor for the balanced case arise from one pole, either north or south, pole of the permanent magnet and give rise to a symmetric or balanced magnetic field in the sensor. This balanced condition is sensed by flux sensor 41 which internally deploys resistors in a balanced bridge or Wheatstone arrangement. In such a balanced arrangement, the output signal from flux sensor 41, taken on output line 42 is nominally a low value, or zero. Output line 42 is connected to a comparator 49. Comparator 49 has a threshold adjustment trimmer 47 which is varied to manner such that output signal on line 42, in a balanced condition, is always below the threshold set by the variable threshold level trimmer 47.

In situation where an unbalanced flux situation is detected, as shown in FIG. 2, the balanced bridge is no longer balanced and an output on line 42 would exceed the threshold level and cause comparator 49 to produce an output signal on line 44 which is transmitted to actuator 53. In the balanced condition shown in FIG. 1, actuator 53, a solenoid, keeps the single pole switch 51 closed so that current may flow in the current loop circuit 21. On the other hand, in the unbalanced circuit condition, arising because of contact by person, P, with the line associated with circuit 21, an unbalanced circuit condition arises. The person, P, acts as a partial ground through a path 50 to ground contact 52, with second coil 25 inducing a different amount of magnetic flux in toroid 27 than the first coil 23. This asymmetry in flux lines causes a first distribution of flux lines 31, as seen in FIG. 2. The second distribution of magnet flux lines 35 is attracted or repelled by the first distribution of magnetic flux 31 generated in the gap of the magnetic member. The first distribution of flux lines 31, is seen to be distorted. This distortion in flux lines 31 represents the attraction or repulsion caused by interaction with the second distribution of flux lines in the flux line mesh zone 37 and indicates an unbalanced condition sensed in the sensitive balanced resistive bridge region of the flux sensor 41. The signal which is output on line 42 exceeds the level of the threshold signal and causes an output from comparator 49 which causes an actuator to open switch 51, thereby breaking the current loop circuit 21 and stopping conduction through the circuit.

Figure 3:
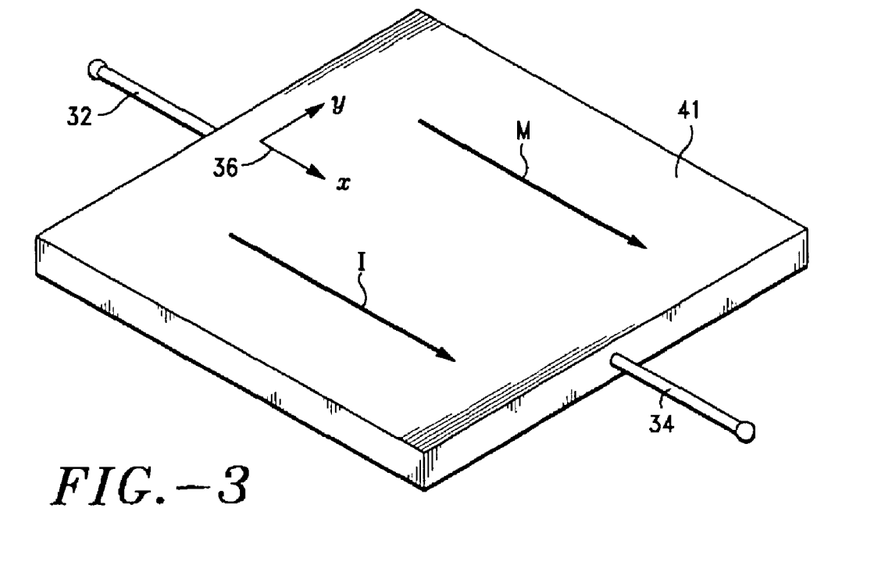
FIG. 3 is a diagram of a flux sensor employed in the apparatus of FIG. 1 with no external magnetic field applied to the sensor.

With reference to FIG. 3, a sensor 41 is seen with input terminal 32 and output terminal 34. Direction of current flow is indicated by the vector I and an internal magnetic field is indicated by the vector M, parallel to vector I. The internal magnetic field is an inherent characteristic of the material of sensor 41, preferably permalloy, as found in the Honeywell sensor previously described. The sensitive region of sensor 41 lies in the XY plane 36, parallel to a major surface of sensor 41. Internal magnetic field M is parallel to the current flow with no external magnetic field applied. In this situation, the internal field of the sensor, represented by arrow M has a vector alignment parallel to the vector alignment of the current I, therefore, the output of sensor is zero.

Figure 4:
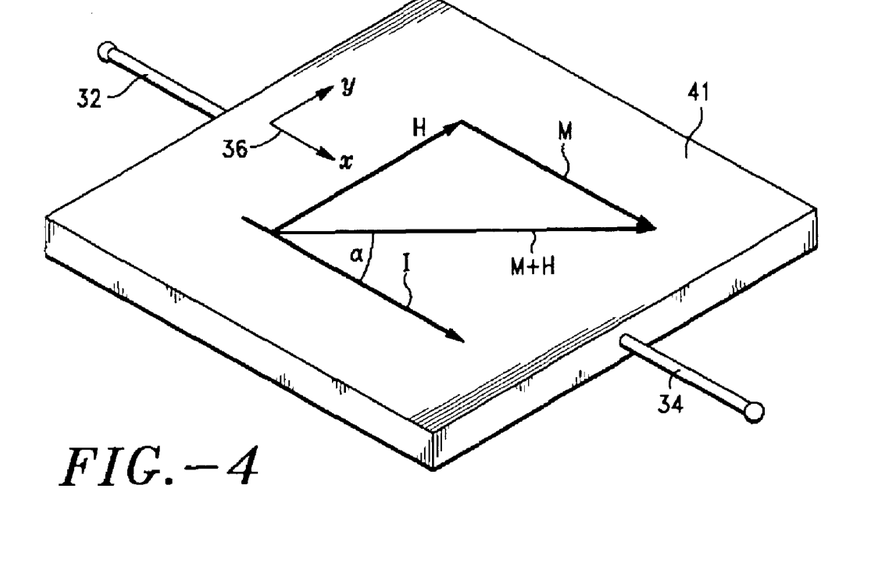
FIG. 4 is a diagram of the flux sensor of FIG. 3 with an external magnetic field applied to the sensor.

In FIG. 4, the sensor 41 is shown to be a planar sensor with an external magnetic field, H extending in the Y direction, perpendicular to the direction of current flow between terminals 32 and 34, indicated by the arrow I. The resultant magnetic field vector, $\overline{M}+\overline{H}$, makes an angle a with reference to the current vector. It can be shown that the resultant resistance change with respect to angle α can be represented by the following equation:

$$R=R_0+\Delta R\cos^3\alpha \quad (1)$$

Wherein $R_0$ and $\Delta R$ are material constants. So it can be seen that the resistance of the sensor has an angular dependence that arises from the applied external magnetic field in any direction in the sensor plane that is not the same as the current flow direction.

Figure 5:
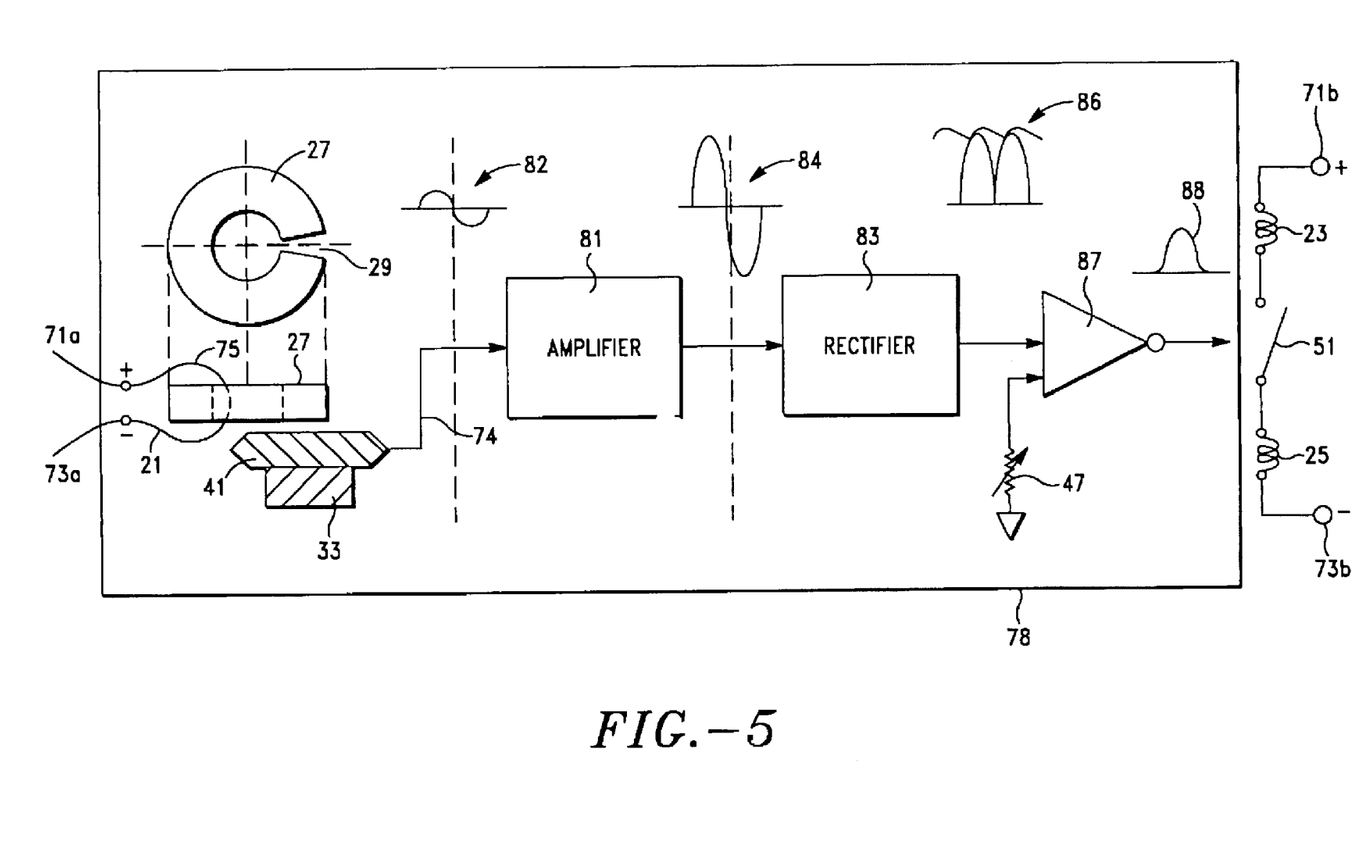
FIG. 5 is an electrical diagram of the apparatus of FIG. 1.

With reference to FIG. 5, the flux sensor 41 is seen to be sandwiched between the permanent magnet 33 and the toroid 27. The physical construction of the apparatus involves placing all components in a single housing 78 which can fit in the same form factor as a conventional circuit breaker. This miniaturization of components allows the present invention to be interchangeable with GFI devices of the prior art. An external circuit may be connected at terminals 71a and 73a which are in common with terminals 71b and 73b. The toroid 27 is placed in a plane parallel to the permanent magnet 33. Magnet 33 has one pole adjacent to flux sensor 41 and the opposite pole of the two-pole magnet distal to the flux sensor.

The flux sensor 41 being packaged in a chip package is arranged with the plane of the chip parallel to permanent magnet 33 and toroid 27. The projected view of the toroid 27 shows the orientation of gap 29 relative to the sensor 41. The external magnetic vector in the flux line mesh zone is preferably perpendicular to the current vector in sensor 41 in the plane of the sensor 41. The output line 74 carries an AC signal 82, representing sensor output from an AC signal in the current loop. The sensor output on line 74 is fed to an AC amplifier 81. The amplified AC signal 84 is fed. in turn, to a full-wave rectifier 83, producing the rectified signal 86. This output is fed to comparator 87 for comparison with the signal from the variable threshold device, namely trimmer 47. A signal 88 exceeding the threshold trips an actuator, not shown, operating switch 51 in a manner previously described. While operation of the present invention has been described with reference to alternating current loops, the apparatus will also work with direct current loops with minor modifications. While the elements of the current sensor shown in FIG. 5 are illustrated in a sandwich relationship with each member of the flux sensor contacting an adjacent member, the elements can be spaced apart. By moving one element, such as the toroid, a predetermined distance away from the permanent magnet, the sensitivity and level of current detection can be changed.

Figure 6:
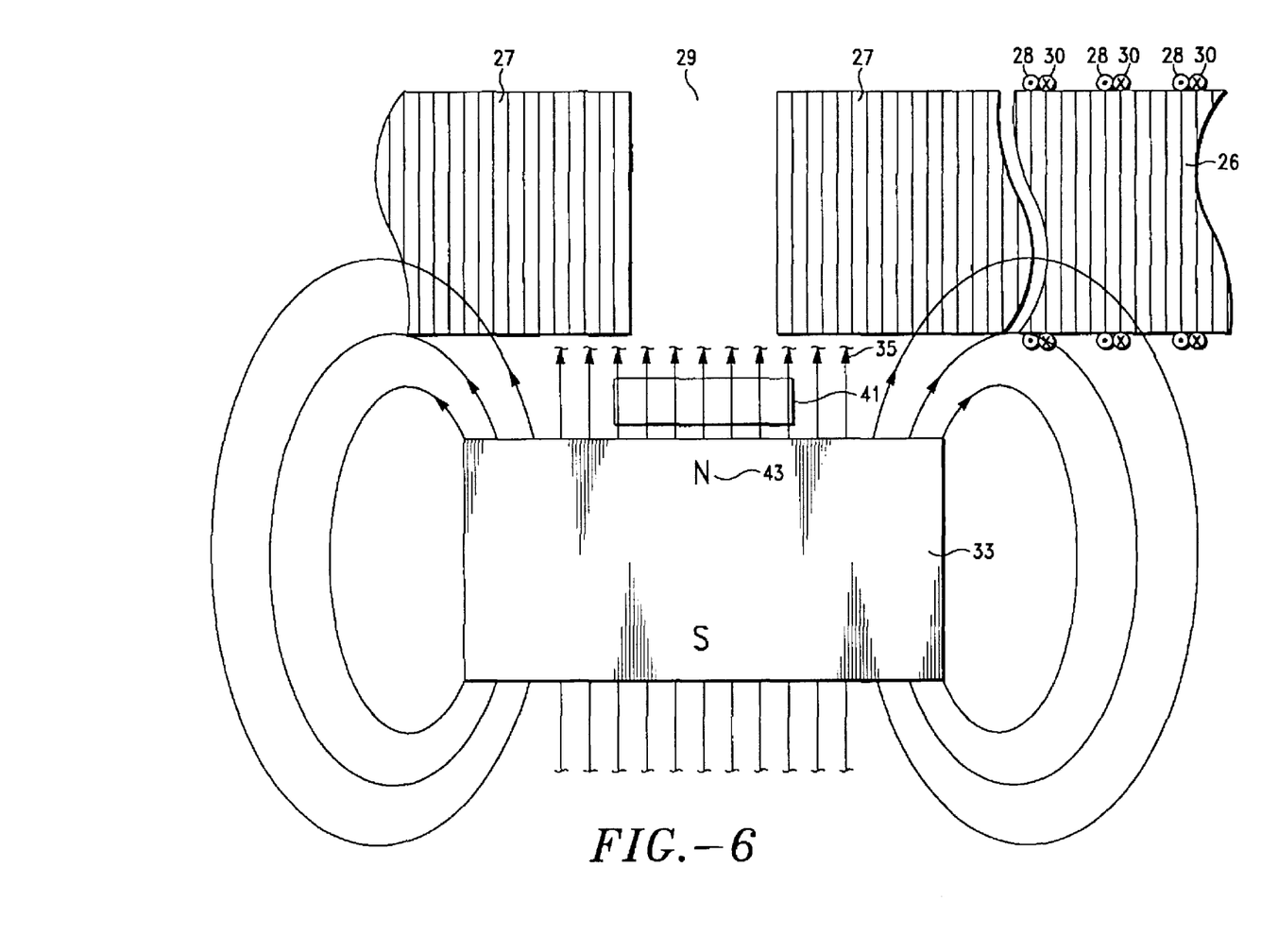
FIGS. 6 and 7 are plan views of a detail of the apparatus of FIGS. 1 and 2, respectively.

With reference to FIG. 6, toroid portion 27, having windings 28 and 30, are shown spiraling around the toroid. The wires are parallel and tightly wound, with the same tension in the two wires 28 and 30 which are a part of the same circuit, but have current flowing in opposite directions. One direction is indicated by a dot and the other by an X. FIG. 6 illustrates the situation where there is no flux in gap 29 associated with balanced currents in windings 28 and 30. Although current is flowing in the windings 28 and 30, current flows in a balanced manner and the induced magnetic fields cancel each other out and so no flux appears in the gap. On the other hand, the permanent magnet 33 has magnetic flux lines 35 emerging from a north pole piece 43 in the Z direction of the sensor, perpendicular to the plane of the sensor. The magnetic flux lines penetrate the flux sensor 41 and loop around to the south pole with the magnet indicated by S. The field H of the sensor is parallel to the direction of current flow 1.

Figure 7:
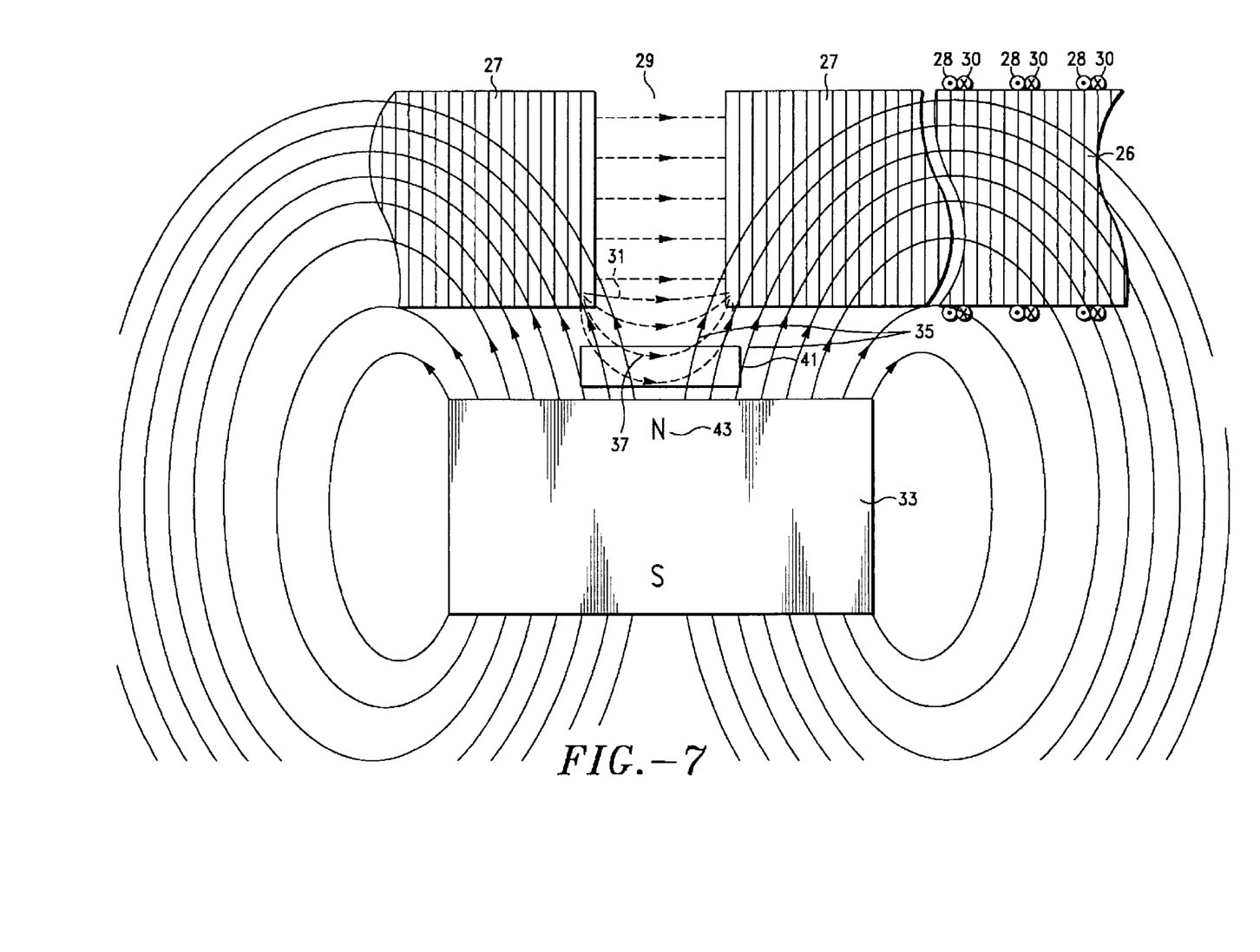

In FIG. 7, there is an unbalanced current situation in windings 28 and 30 which causes a distribution of flux lines 31 in gap 29. These flux lines intermesh with a second distribution of flux lines 35 associated with the magnet 33, as previously described. There is a mesh zone 37 where the flux lines permeate each other, giving rise to flux lines in the plane of the sensor at an angle to the direction of current flow. The external flux has overcome the internal flux giving rise to an resistance at a vector angle a relative to the current flow. Part of the mesh zone resides in the flux sensor 41 where an unbalanced current condition exists in the Wheatstone bridge associated with the flux sensor, giving rise to an output signal indicating an unbalanced current exceeding a threshold. Thus, the field from the permanent magnet helps to guide the external field from magnetic member 27 such that at least a portion of the latter field lies in the plane of sensor 41 with a component of field strength perpendicular to the direction of current flow and strong enough to overcome the internal magnetic field. As the toroidal member exhibits different degrees of imbalance, the magnetic field strength in the gap of the toroid will change proportionally. The permanent magnet below the sensor will cause deflection of field lines emerging from the gap into the plane of the sensor with a changing field strength. The changing field strength must have a vector component changing in the plane of the sensor perpendicular to the direction of current flow. This change results in a proportional change in resistance of the sensor, giving rise to a change in a reference current through the sensor. Changes in the reference current are amplified and handled as explained with reference to FIG. 5.

What is claimed is:

1. An apparatus for sensing unbalanced DC and AC currents over a threshold amount comprising:

a magnetic member having an associated unbalanced current loop with a pair of current windings about a magnetic member inducing first magnetic field lines that are emitted from the interior of the magnetic member outwardly into a spatial region extending away from the magnetic member in a first direction and with the first magnetic field lines absent when the current loop is balanced;

a magnetoresistive sensor having a region sensitive to external magnetic fields, the sensor, located in proximity to the magnetic member, having an output line carrying a signal representing the external magnetic field lines; and a magnet generating second magnetic field lines interacting with the first magnetic field lines in a manner bending the first magnetic field lines into the sensitive region of the sensor.

2. The apparatus of claim 1 wherein said magnet is a permanent magnet having a single pole facing said magnetic member.

3. The apparatus of claim 1 wherein the magnetic member is toroidal, having a cross-sectional gap emitting said first magnetic flux lines.

4. The apparatus of claim 3 wherein the toroidal magnetic member, the sensor chip package and the magnet are contiguous and mounted in a common housing.

5. An apparatus for sensing unbalanced DC and AC currents over a threshold amount in a ground fault detector and circuit breaker comprising:

a toroidal member of magnetic material having a cross sectional gap and associated with a current carrying circuit having helical windings wrapped about the toroidal member, the circuit carrying current in a balanced state and a fault state, the windings of the circuit inducing magnetic fields in the magnetic material, with no magnetic flux lines emerging from the cross sectional gap for a balanced current state and a distribution of first magnetic flux lines in the gap for the fault state;

a permanent magnet paced apart from the toroidal member and in magnetic field communication therewith, with second magnetic flux lines that permeate the first magnetic flux lines in a flux line mesh zone existing between the permanent magnet and the gap of the toroidal member in the fault state but with no flux line mesh zone in the balanced state;

a flux sensor disposed between the toroidal member and the permanent magnet, the flux sensor having a region sensitive to external magnetic fields of said mesh zone and producing a signal in response thereto; and a circuit interruption actuator switch electrically communicating with the helical windings carrying current, the actuator and switch responsive to the signal in a manner opening the current carrying circuit.

6. The apparatus of claim 5 wherein the sensitive region of the flux sensor is planar with at least some of the flux lines in said mesh zone line in the plane of the sensor.

7. The apparatus of claim 5 wherein the flux sensor is sandwiched between the toroidal member and the permanent magnet within a container.

8. The apparatus of claim 6 wherein the direction of second flux lines from the permanent magnet is upright relative to a horizontal plane of the flux sensor, the second flux lines bending the first flux lines into said horizontal plane.

9. The apparatus of claim 5 wherein the helical windings are two windings wound in parallel about the toroidal member.

10. The apparatus of claim 5 wherein the current is an alternating current.

11. The apparatus of claim 5 wherein the current is a direct current.

12. The apparatus of claim 5 wherein the circuit interruption breaker comprises an actuator and a switch.

13. The apparatus of claim 12 wherein said breaker further comprises a variable threshold adjuster connected to a comparator wherein said signal is above a threshold level defined by the adjuster in the comparator.

14. An apparatus for sensing unbalanced DC and AC currents over a threshold amount in a ground fault detector and circuit breaker comprising:

a toroidal member of magnetic material having a cross sectional gap and associated with a circuit having helical windings wrapped about the toroidal member carrying current, carry currents at different times in a non-fault state and a fault state, the current windings inducing cancelling magnetic fields in the magnetic material by balanced opposing magnetic flux lines for the non-fault state and an unbalanced distribution of first magnetic flux lines for the fault states;

a permanent magnet spaced apart from the toroidal member and in magnetic field communication therewith, the permanent magnet having second magnetic flux lines that extend toward the gap of the toroidal member;

a flux sensor in a sandwich relation to the toroidal member on a first side and the permanent magnet on a second side, opposite to the first side, the flux sensor having a region sensitive to external magnetic field lines and producing a signal at an output in response to sensing the unbalanced distribution of flux lines; and a circuit interruption breaker responsive to the output signal of the flux sensor by opening the current carrying circuit.

15. The apparatus of claim 14 wherein the flux sensor is magnetoresistive sensor.

16. The apparatus of claim 15 wherein the region sensitive to external magnetic field lines lies in a plane.

17. The apparatus of claim 15 wherein the flux sensor is sandwiched between the toroidal member and the permanent magnet within a container.

18. The apparatus of claim 16 wherein the planar sensitive region intercepts the first magnetic flux lines being bent into said plane by the second flux lines.

19. The apparatus of claim 14 wherein the helical windings are two parallel windings wound to cancel out magnetic flux due to balanced current and create a magnetic flux proportional to the amount of imbalanced current.

20. The apparatus of claim 14 wherein the current is an alternating current.

21. The apparatus of claim 14 wherein the current is a direct current.

22. The apparatus of claim 14 wherein the toroidal member, the flux sensor, and the permanent magnet are contiguous.

* * * * *

UNITED STATES PATENT AND TRADEMARK OFFICE
CERTIFICATE OF CORRECTION

PATENT NO.   : 6,710,587 B1
DATED        : March 23, 2004
INVENTOR(S)  : Aaron L. Reynoso et al.

It is certified that error appears in the above-identified patent and that said Letters Patent is hereby corrected as shown below:

Column 2,
Line 43, "No. 5,923,514 shows use of a GM device within the gap of" should read -- No. 5,923,514 shows use of a GMR device within the gap of --.

Column 4,
Lines 8-9, "www.magneticsensors.com/spec$_{13}$sheets/specs_1501.html." should read -- www.magneticsensors.com/spec_sheets/specs_1501.html. --.

Column 5,
Lines 12-13, "makes an angle a with reference to the" should read -- makes an angle $\propto$ with reference to the --.

Column 6,
Line 20, "angle a relative to the current flow" should read -- angle $\propto$ relative to the current flow --.

Column 7,
Line 16, "a permanent magnet paced apart from the" should read -- a permanent magnet spaced apart from the --.

Signed and Sealed this

Twenty-eighth Day of December, 2004

JON W. DUDAS
*Director of the United States Patent and Trademark Office*